United States Patent
Bomya et al.

(10) Patent No.: US 6,317,048 B1
(45) Date of Patent: Nov. 13, 2001

(54) MAGNETIC FIELD SENSOR

(75) Inventors: Timothy J. Bomya, Westland; Alan J. Riggs, Ann Arbor, both of MI (US)

(73) Assignee: Automotive Systems Laboratory, Inc., Farmington Hills, MI (US)

(*) Notice: Subject to any disclaimer, the term of this patent is extended or adjusted under 35 U.S.C. 154(b) by 0 days.

(21) Appl. No.: 09/662,742

(22) Filed: Sep. 15, 2000

Related U.S. Application Data

(60) Provisional application No. 60/154,291, filed on Sep. 16, 1999.

(51) Int. Cl.$^7$ .................................................. G08B 23/00
(52) U.S. Cl. ................. 340/573.1; 340/436; 340/547; 340/667; 280/735; 180/274
(58) Field of Search ........................... 340/540, 547, 340/667, 436, 435, 438, 545.1, 545.2, 430, 573.1, 551, 941, 933, 686.2, 686.6, 686.5; 180/274, 282; 280/735; 307/10.71; 324/212, 252; 73/35.12

(56) References Cited

U.S. PATENT DOCUMENTS

| | | | |
|---|---|---|---|
| 1,813,746 | 7/1931 | Kinsley | 324/243 |
| 2,826,634 | 3/1958 | Atkinson et al. | 358/301 |
| 3,947,826 | 3/1976 | Bockwoldt | 348/441 |
| 4,430,645 | 2/1984 | Eskandry et al. | 340/572 |
| 4,531,091 | 7/1985 | Kusenberger et al. | 324/242 |
| 5,073,858 | 12/1991 | Mills | 600/410 |
| 5,161,820 * | 11/1992 | Vollmer | 280/730 |
| 5,177,445 | 1/1993 | Cross | 324/637 |
| 5,264,794 | 11/1993 | Burke et al. | 324/260 |
| 5,416,711 * | 5/1995 | Gran | 364/438 |
| 5,543,988 | 8/1996 | Brady et al. | 360/112 |
| 5,570,903 * | 11/1996 | Meister et al. | 340/438 |
| 5,580,084 | 12/1996 | Gioutsos | 280/735 |
| 5,594,849 | 1/1997 | Kuc et al. | 345/435 |
| 5,646,613 | 7/1997 | Cho | 340/903 |
| 5,707,076 | 1/1998 | Takahashi | 280/735 |
| 5,729,016 * | 3/1998 | Klapper | 348/148 |
| 5,739,757 * | 4/1998 | Gioutsos | 340/667 |
| 5,747,696 | 5/1998 | Kwun et al. | 73/728 |
| 5,793,200 | 8/1998 | Berrill | 324/207.2 |
| 5,914,610 | 6/1999 | Gershenfeld et al. | 324/663 |
| 6,039,345 | 3/2000 | Cech et al. | 280/735 |
| 6,094,610 | 7/2000 | Steffens, Jr. et al. | 701/45 |

FOREIGN PATENT DOCUMENTS

| | | | |
|---|---|---|---|
| 0 453 824 A1 | 10/1991 | (EP) | G01B/7/14 |
| 56-157802 | 5/1981 | (JP) | G01B/7/28 |

OTHER PUBLICATIONS

Kwun, H., "Magnetostrictive Sensors Technology", reprinted from Technology Today, Mar. 1995, pp. 3–7.

Uras, M., "Signal Detection Methods for Magnetostrictive Sensors", 970604, reprinted from *Sensors and Actuators* 1997, SP–1220, Society of Automotive Engineers, Feb. 24, 1997, pp. 23–33.

* cited by examiner

Primary Examiner—Jeffery Hofsass
Assistant Examiner—Anh La
(74) Attorney, Agent, or Firm—Dinnin & Dunn P.C.

(57) ABSTRACT

A magnetic field sensor comprising a plurality of magnetic sensing elements and a means for generating an image signal from the plurality of the signals generated thereby is used i) to sense a magnetic field proximate to a body portion of a vehicle for adjusting a magnetic circuit thereof, ii) to sense an occupant in a seat of a vehicle, or iii) to sense from within a body portion of a vehicle magnetic-field-influencing objects proximate thereto. In another aspect, the magnetic field sensor further comprises a plurality of magnetic focusing elements proximate to the magnetic sensing elements for improving the clarity of the magnetic image.

22 Claims, 4 Drawing Sheets

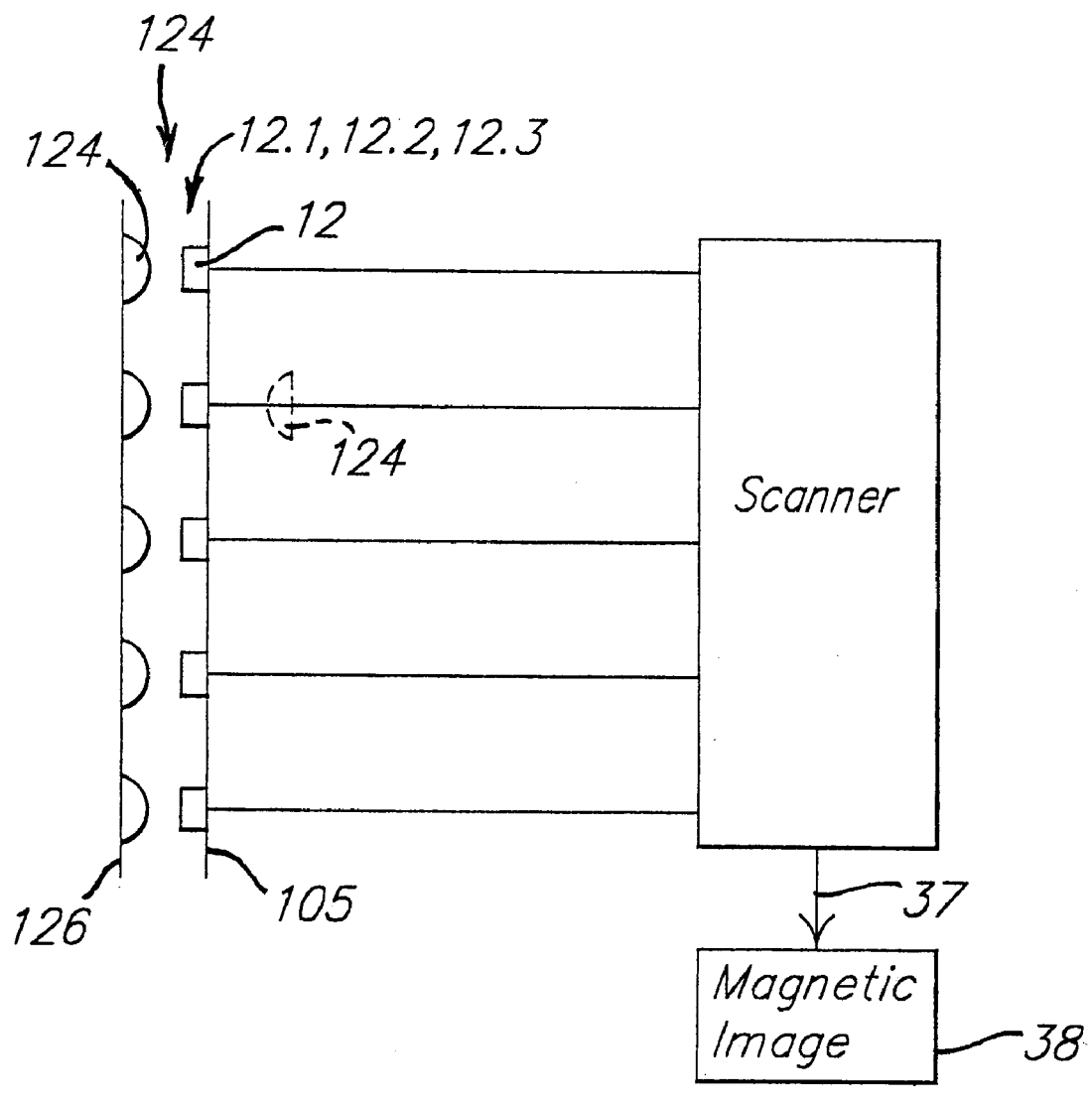
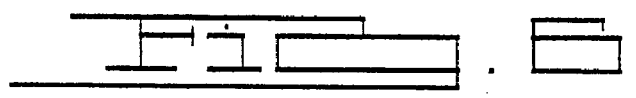

MAGNETIC FIELD SENSOR

The instant application claims the benefit of prior U.S. Provisional Application Ser. No. 60/154,291 filed on Sep. 16, 1999, which is incorporated herein by reference.

The instant application is related to U.S. application Ser. Nos. 09/649,416, 09/648,606, 09/649,415, 09/649,414, 09/648,528, 09/648,605, 09/648,601 and 09/648,607, each entitled "Magnetic Sensor", each filed on Aug. 26, 2000.

In the accompanying drawings:

FIG. 6 illustrates a plurality of magnetic sensing elements with an associated plurality of magnetic focusing elements.

Figure 1:
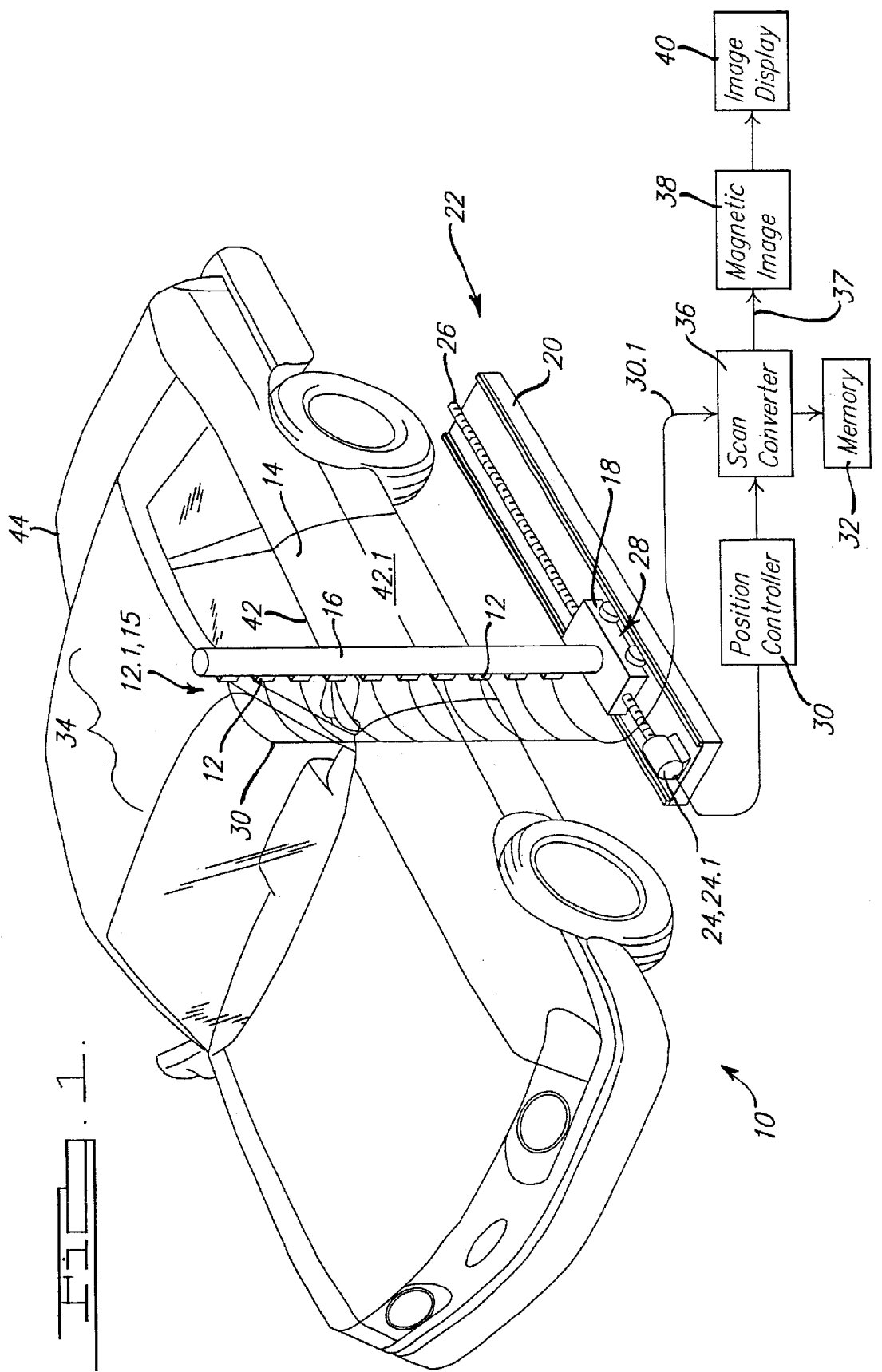
FIG. 1 illustrates an embodiment of a magnetic field sensor for measuring a magnetic field proximate to a body portion of a vehicle.

Referring to FIG. 1, a magnetic field sensor 10 comprises a plurality of magnetic sensing elements 12.1 at a respective plurality of locations for providing a measurement of a magnetic field 14. For example, in accordance with one embodiment, the plurality of magnetic sensing elements 12.1 are arranged in a one-dimensional array 15 along a column 16 supported by a carriage 18 that is translated along a track 20 by a positioner 22. The positioner 22, for example, comprises a motor 24 that rotates a screw 26 engaging a nut 28 operatively connected to the carriage 18. The position of the positioner 22 is controlled by a position controller 30. The position controller 30 monitors the position of the carriage 18, either directly with a position sensor (not shown) operatively connected thereto, or indirectly from the rotational position of the screw 26, which can be measured for example with an encoder attached thereto, from a tachometer attached to the motor 24 or screw 26, or by inference of motor position by counting steps applied to a stepper motor 24.1.

Each magnetic sensing element 12 generates a signal 30 responsive to the strength of the magnetic field 14 thereat. Each magnetic sensing element 12 comprises, for example, a Hall-effect sensor, a coil, or a SQUID which is either attached directly to the supporting column 16, or is attached to a substrate such as a printed circuit board or a flexible circuit. The plurality of magnetic sensing elements 12.1 generate a plurality of signals 30.1 that provide a measure of the magnetic field 14 along the one-dimensional array 15. The magnetic field 14 is mapped by successively measuring the one-dimensional measurements of magnetic field strength from the magnetic sensing elements 12.1, recording the measurements in a memory 32, and recording the associated carriage position from the position controller 30. The carriage is then translated to a new location by the positioner 22 under control of the position controller 30, after which the operations of measuring and recording the one-dimensional measurements of magnetic field strength from the magnetic sensing elements 12.1, and recording the carriage position, are repeated. These operations are repeated for successive carriage positions so as to provide measurement of the magnetic field 14 over a region of interest 34. A scan converter 36 generates a magnetic image 38 of the magnetic field 14 from the signals 30.1, for example, in a format suitable for display on an image display 40.

Figure 2:
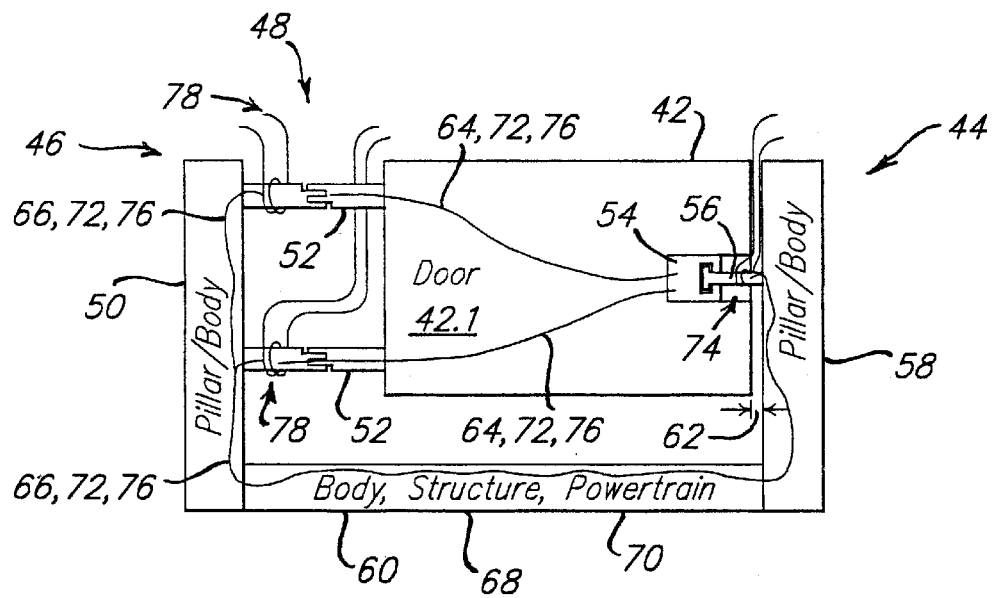
FIG. 2 illustrates a magnetic sensor in a body portion of a vehicle.

As illustrated in FIG. 1, the magnetic field sensor 10 is useful for sensing the magnetic field 14 proximate to a body portion 42, for example a door 42.1, of a vehicle 44. Referring to FIG. 2, the magnetic field sensor 10 can be used to form a magnetic image 38 of a door 42.1 that is part of a magnetic circuit 46 of a magnetic sensor 48. The door 42.1 hinges with respect to a first pillar 90 about a plurality of hinges 52, and has a latch/lock mechanism 54 that latches to a striker 56 on a second pillar 58. The door 42.1—typically constructed with magnetically-permeable steel—has intrinsic magnetic properties. For example, the door 42.1 conducts magnetic flux, thereby enabling a permanent magnet to stick thereto. The hinges 52 provide a relatively low reluctance path between the door 42.1 and the first pillar 50. Moreover, the latch/lock mechanism 54 and the striker 56, when engaged, provide a relatively low reluctance path between the door 42.1 and the second pillar 58. Elsewhere, the door 42.1 is normally magnetically separated from the body 60 of the vehicle 44 by an associated air gap 62. Accordingly, the hinges 52 and striker 56 are magnetically connected by a first magnetic path 64 along the door 42.1. Moreover, the first 50 and second 58 pillars—to which the hinges 52 and striker 56 are respectively attached—are magnetically connected by a second magnetic path 66—distinct from the first magnetic path 64—comprising the body 60, structure 68, or powertrain 70 of the vehicle 44. Accordingly, the door 42.1 is part of a magnetic circuit 46 that is similar in nature to the core of a transformer, as illustrated in FIG. 2, wherein the first 64 and second 66 magnetic paths together constitute a closed magnetic path 72. The magnetic circuit 46 further comprises at least one magnetic sensing element 74 for sensing a magnetic flux 76 conducted by the magnetic circuit 46. The magnetic circuit 46 may further comprise one or more coils 78 for generating a magnetomotive force therein.

In operation, the above described magnetic sensor 48 is responsive to changes to the magnetic circuit 46, for example as a result of a displacement or deformation of the door 42.1 or the proximity of a ferromagnetic object such as another vehicle to the door 42.1 that influences the leakage flux that extends beyond the magnetic circuit 46, for example proximate to air gaps 62 within the magnetic circuit 46. The performance of the magnetic sensor 48 can be adjusted by adjusting the magnetic circuit 46 thereof, or by adjusting the location of the associated magnetic sensing elements 72 thereof. For example, the magnetic circuit 46 can be adjusted by modifying the ferromagnetic structure thereof by locating or relocating elements thereof, or by modifying the location of the associated coils 76 that generate magnetomotive force therein.

The magnetic field sensor 10 can be used to provide a magnetic image 38 of the magnetic circuit 46, for example, a magnetic image of the magnetic field 14 proximate to a door 42.1, so as to enable the performance of the associated magnetic sensor 48 to be adjusted. Accordingly, a method of forming and using a magnetic image of a body portion 42 of a vehicle 44 comprises sensing a magnetic field 14 at a plurality of locations proximate to the body portion 42 so as to generate a plurality of signals 30.1, wherein each signal 30 of the plurality of signals 30.1 is responsive to a magnetic field strength at one of the plurality of locations. The method further comprises generating an image signal 37 from the plurality of signals 30.1, and using a magnetic image 38 from the image signal 37 to adjust a magnetic circuit 46 containing the body portion 42 that is sensed by the magnetic sensor 48.

Figure 3:
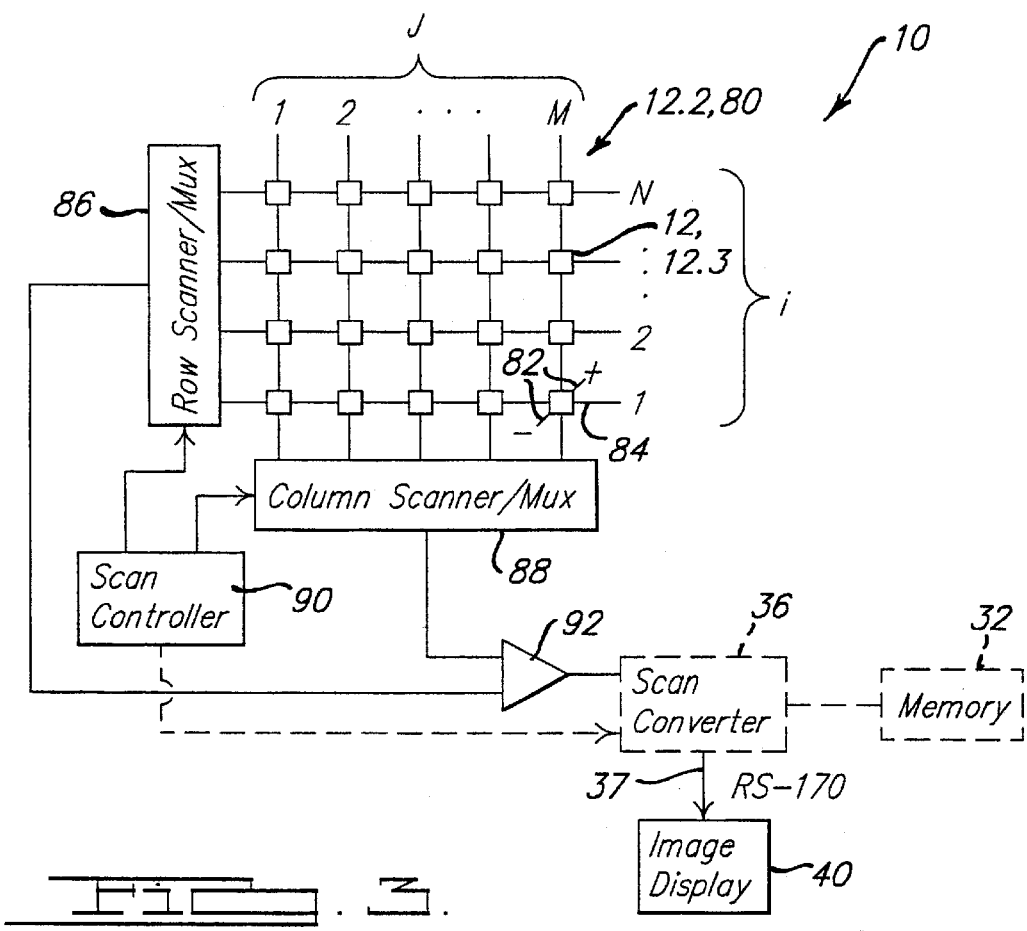
FIG. 3 illustrates an embodiment of a magnetic field sensor comprising a two-dimensional array of magnetic sensing elements.

Referring to FIG. 3, in accordance with another embodiment of a magnetic field sensor 10, a plurality of magnetic sensing elements 12.2 are arranged in a two-dimensional array 80 of rows (i) and columns (j) that can be used to form a magnetic image 38 without having to move the magnetic field sensor 10 relative to the object being imaged. For example, each magnetic sensing element 12 of the plurality of magnetic sensing elements 12.2 comprises a Hall-effect sensor element 12.3 which is a four terminal semiconductor device wherein a magnetic field interacting with a current between two of the four terminals—source terminals 82—causes a voltage across the remaining two terminals—sense terminals 84—, whereby the directions of the current flow, magnetic field and a resulting voltage-producing electric field are mutually orthogonal. For each Hall-effect sensor element 12.3, the two source terminals 82 are operatively connected to a voltage or current source, one of the sense terminals 84 is connected to a row scanner/mulitplexer (MUX) 86, and the other of the sense terminals 84 is connected to a column scanner/mulitplexer (MUX) 88. Under control of a scan controller 90, the respective sense terminals of a particular Hall-effect sensor element 12.3 at a particular location (i,j) of the two-dimensional array 80 are operatively connected to an amplifier 92, the output of which is operatively connected to an image display 40. The two-dimensional array 80 of Hall-effect sensor elements 12.3 may for example be mounted on a circuit board or other substrate. The scan controller 90 and associated row scanner/MUX 86 and column scanner/MUX 88 may, for example, be adapted to operate in accordance with a RS-170 time base so as to provide an image signal 37 that is compatible with a standard broadcast video monitor or processed by an RS-170 compatible frame grabber in the image display 40. For example, the magnetic sensing elements 12.2 of the two-dimensional array 80 may comprise a 525×100 array of Hall-effect sensor element 12.3 so as to directly provide a RS-170 format signal by sequentially reading the respective Hall-effect sensor element 12.3 with the scan controller 90. The RS-170 format, for example, is directly compatible with existing video display equipment. Alternately, for a two-dimensional array 80 or scan controller 90 not directly compatible with the format of the image display 40, a scan converter 36 may be operatively connected between the amplifier 92 and image display 40 to format the magnetic image 38 from the magnetic sensing elements 12.3 so as to provide an image signal 37 suitable for display on the image display 40. For example, the scan converter 36 may provide a transformation of time base, a logic transformation, an interpolation, or a linear or non-linear operation on the signals 30.1 from the magnetic sensing elements 12.2 in the process of generating a image signal 37 compatible with the image display 40. The magnetic field sensor 10 of FIG. 3 may be used for sensing the magnetic field proximate to a body portion 42 of a vehicle 44, as illustrated in FIGS. 1 and 2.

It should be understood that the magnetic field sensor 10 could also be embodied as a subset of at least one magnetic sensing element 12 that is translated in two directions, for example X and Y, so as to provide a plurality of signals 30.1, corresponding to a region of interest 34, from which a magnetic image 38 is formed by an associated scan converter 36 from the plurality of signals 30.1 and associated X and Y positions of the at least one magnetic sensing element 12.

It should be understood that when a plurality of magnetic sensing elements 12.1, 12.3 are used, the associated signals 30.1 from the associated magnetic sensing elements 12 may be read, by the scan converter 36 or other means for forming a magnetic image 38, either sequentially or in parallel.

Figure 4:
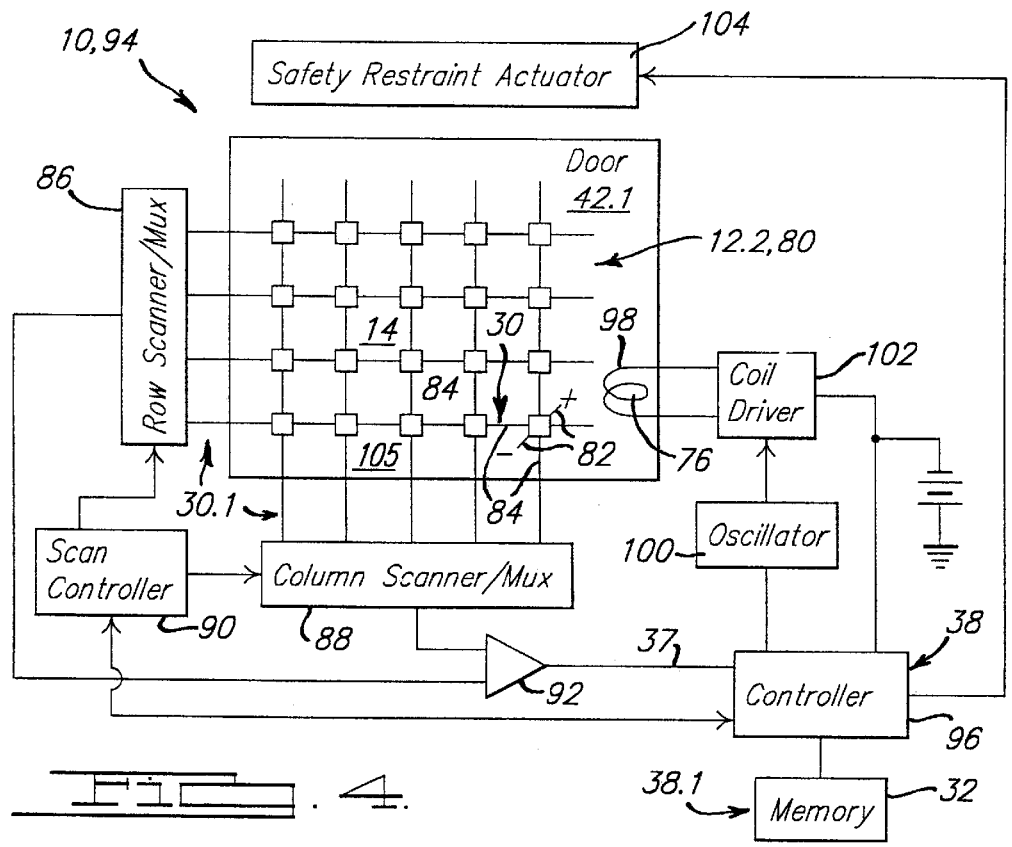
FIG. 4 illustrates an embodiment of a magnetic field sensor comprising a two-dimensional array of magnetic sensing elements in a body portion of a vehicle.

Referring to FIG. 4, the two-dimensional array 80 of the magnetic field sensor 10 of FIG. 3 may be incorporated in a body portion 42 of a vehicle for use as a crash sensor 94. For example, a two-dimensional array 80 of magnetic sensing elements 12.2, particularly Hall-effect sensor elements 12.3, may be incorporated in the skin of a door 42.1, for example, a plastic or composite door skin. For each Hall-effect sensor element 12.3, the two source terminals 82 of are operatively connected to a voltage or current source, one of the sense terminals 84 is connected to a row scanner/mulitplexer (MUX) 86, and the other of the sense terminals 84 is connected to a column scanner/mulitplexer (MUX) 88. Under control of a scan controller 90, the respective sense terminals of a particular Hall-effect sensor element 12.3 at a particular location (i,j) of the two-dimensional array 80 are operatively connected to an amplifier 92, the output of which comprises an image signal 37 that is operatively connected to a controller 96, which is also in communication with the scan controller 90 so as to associate the image signal 37 with a particular location (i,j) of the two-dimensional array 80. A coil 98 may be provided in the door 42.1 as necessary to generate a magnetic field 14 that is to be sensed by the magnetic sensing elements 12.2, although in some applications the residual magnetism in the door may provide a sufficiently strong magnetomotive force to preclude the need for a separate coil 98. An oscillating signal, generated by an oscillator 100 operatively connected to the controller 96, is operatively coupled to the coil 98 by a coil driver 102.

In operation, an image of the magnetic field 14 of the door 42.1 is sensed by the controller 96 from the image signal 37. The magnetic field 14 is generated either by the residual magnetism of the door 42.1, a permanent magnet (not illustrated) in the door 42.1, the magnetism of the surroundings, or a magnetic flux generated by the coil 98 in the door 42.1 responsive to an voltage or current signal applied thereto. A magnetic-field-influencing object, for example a ferromagnetic object such a another vehicle, interacting with the magnetic field 14 proximate to the door 42.1 causes a perturbation of the magnetic field 14, which is detected by the magnetic sensing elements 12.2 and which is sensed by the controller 96 as a change in the associated magnetic image 38 of the image signal 37. The controller compares over time the magnetic image 38 with one or more associated stored magnetic images 38.1 for various scenarios, and responsive to the detection of a collision or impending collision, controls the actuation of an associated safety restraint actuator 104—for example a side-impact air bag inflator—so as to mitigate injury to an associated occupant in the vehicle 44.

Accordingly, another embodiment of a magnetic field sensor 10 comprises a plurality of magnetic sensing elements 12.2 disposed on a first surface 105, a means for generating an image signal 37 from the plurality of the signals; and a means for discriminating from the image signal 37 an object proximate to the body portion 42. For example, each of the magnetic sensing elements 12.2 may comprise a Hall-effect sensor element 12.3. The plurality of magnetic sensing elements 12.2 are, for example, disposed so as to form a two-dimensional array 80 on the first surface 106. The first surface 106 is, for example, located within a body portion 42 of a vehicle 44, whereby each magnetic sensing element 12 generates a signal responsive to a magnetic field 14 thereat, the plurality of magnetic sensing elements 12.2 thereby generating a corresponding plurality of the signals. The image signal 37 from the plurality of signals may be used to visualize the magnetic field 14 proximate to the body portion 42 for either crash anticipation, crash safing, or crash detection. A safety restraint actuator 104 may be controlled responsive to the means for discriminating from the image signal 37 an object proximate to the body portion 42. The means for discriminating may for example comprise a microprocessor with associated image processing software.

The means for generating an image signal 37 may for example comprise a scan converter 36, which converts the plurality of the signals from the magnetic sensing elements 12.2 to an image signal 37, for example an RS-170 format signal, an RGB format signal, or a raster display signal. Alternately, the plurality of magnetic sensing elements 12.2 may be adapted so as to generate an image signal 37 directly from an associated scanning process, without the need for scan conversion. The magnetic field sensor 10 may further comprise an image display 40 operatively connected to the means for generating an image signal 37 for displaying the associated magnetic image 38.

A method of forming and using a magnetic image 38 from a body portion 42 of a vehicle 44 comprises sensing a magnetic field 14 at a plurality of locations—for example a two-dimensional array 80 of locations—from within the body portion 42 so as to generate a plurality of signals 30.1, wherein each signal 30 of the plurality of signals 30.1 is responsive to a magnetic field strength at one of the plurality of locations. An image signal 37 is generated from the plurality of signals 30.1, and an object is detected proximate to the body portion 42 from the image signal 37. A safety restraint actuator 104 may be actuated responsive to the detection of an object proximate to the body portion 42 of the vehicle 44, for example, if the a detected position of the object changes over time so as to indicated the likelihood of a collision.

Figure 5:
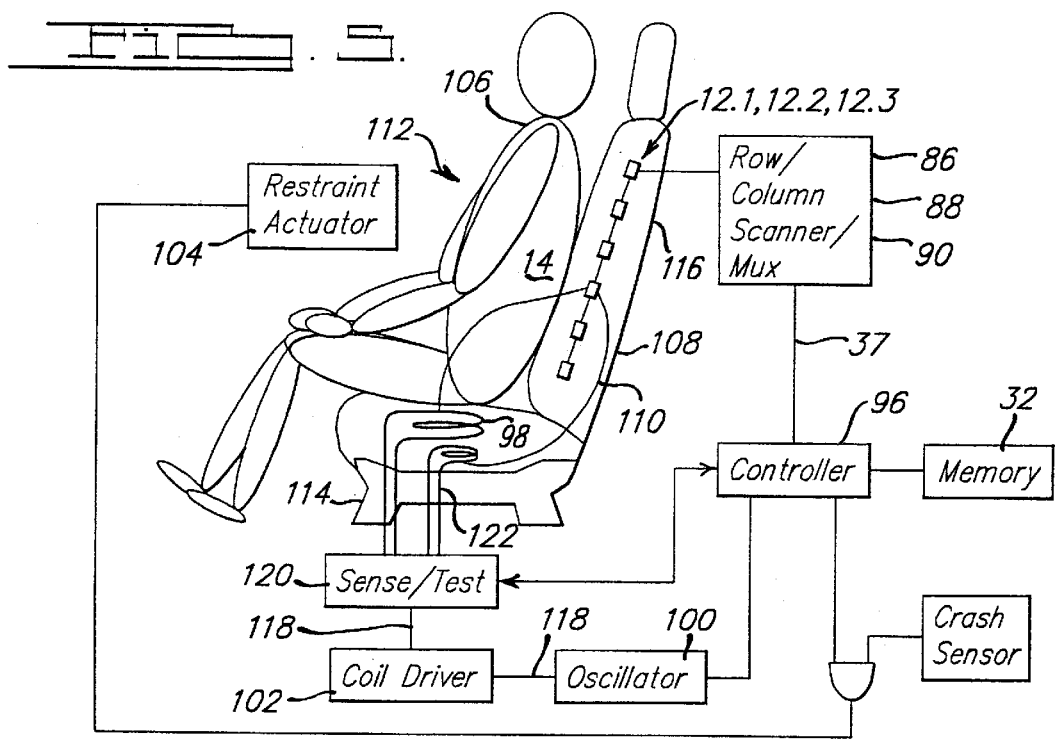
FIG. 5 illustrates an embodiment of a magnetic field sensor for sensing an occupant in a seat of a vehicle.

Referring to FIG. 5, another embodiment magnetic field sensor 10 is used to sense an occupant 106 in a seat 108 responsive to the permanence of iron-containing-blood, which is sufficient to influence a magnetic flux 110 in a magnetic circuit 112 enough to be detectable by a one- 15 or two-dimensional array 80 of magnetic sensing elements 12.1, 12.2. The magnetic flux 110 is generated by at least one coil 98, for example located in a seat base 114, and is sensed by the magnetic sensing elements 12.1, 12.2 at a separate location, for example in the seat back 116.

The at least one coil 98 is operatively connected to a corresponding signal 118 comprising a sinusoidal voltage generated by an oscillator 120. For example, the oscillator 120 may comprise a crystal stabilized (i.e. substantially drift-free) TTL square wave signal generated by a controller 96 and subsequently filtered by a band-pass filter. The oscillation frequency of the oscillator 120 is selected, as a function of the expected noise sources, to enhance system performance. For example, a frequency different from that of AC power lines (e.g. 60 Hz), such as an ultrasonic frequency, might be chosen to avoid interference therefrom. The oscillator 120 may be modulated in amplitude, frequency, or by bursting. The signal from the oscillator 120 is fed to a coil driver 102, for example, through a buffer amplifier.

The at least one coil 98 is driven by an associated at least one coil driver 102 that provides sufficient power at an impedance compatible with the at least one coil 98 so that the resulting magnetic field is sufficiently strong to be detected by the magnetic sensing elements 12.1, 12.2. The at least one coil driver 102 is also, for example, provided with short circuit protection and is operated so as to avoid saturation or clipping of the signal 118. The at least one coil driver 102 is designed to operate in an automotive environment, for example to operate over an associated range of possible battery voltages. The signal 118 from the at least one coil driver 102 may, for example, be either a voltage signal or a current signal.

The at least one coil driver 102 drives the at least one coil 98 through a sense/test circuit 120, which senses either a current or voltage from the at least one coil 98, or a signal from a supplemental sense coil 122 or a combination of the three, to confirm or test the operation of the at least one coil 98. For example, a supplemental sense coil 122 could directly sense the magnetic flux generated by the at least one coil 98. The sense/test circuit 120 may also, for example, test the at least one coil 98 for an open or short so as to improve the reliability of the magnetic field sensor 10, particularly when used to control the actuation of a safety restraint actuator 104, so as to prevent a false deployment or a failure to deploy when necessary. The integrity, or health, of the at least one coil 98 is, for example, tested every measurement cycle. The sense/test circuit 120 can also provide a measure of the power delivered to the at least one coil 98 which can provide an indication of the presence and type of object on the seat 108.

The at least one coil 98 may, for example, be series resonated to increase the current flow therein, thereby increasing the amount of magnetic flux 110 generated by the at least one coil 98. The magnetic flux 110 from the at least one coil 98 extends into the region of space proximate to the at least one coil 98, including the region of occupancy above the seat 108, and is attracted to materials of relatively high permanence therein, for example steel components such as the seat frame or seat springs. The at least one coil 98 is part of a magnetic circuit 112 that extends through the region of seat occupancy to the magnetic sensing elements 12.1, 12.2. Increased magnetic flux in the magnetic circuit 112 provides for a higher signal-to-noise ratio in the signal or signals received or detected by the magnetic field sensor 10. The at least one coil 98 may be compensated for variations in temperature by incorporating an associated temperature sensor.

The magnetic sensing elements 12.1, 12.2 sense from the magnetic flux 110 a sinusoidal carrier that is modulated responsive to the reluctance of the magnetic circuit 112. This signal from the magnetic sensing elements 12.1, 12.2 is amplified, demodulated, converted to digital format, and read by the controller 96.

In operation, the signal 118 operatively coupled to the associated at least one coil 98 by the associated at least one coil driver 102 causes a current flow in the at least one coil 98 which generates a magnetic flux in the magnetic circuit 112. A magnetic circuit 112 is characterized by a reluctance R, wherein the amount of flux $\phi$ in a magnetic circuit for a given magnetomotive force F is given by $\phi=F/R$. The reluctance R of a series magnetic circuit is given by the sum of the respective reluctances of the respective elements in series. The reluctance of air is significantly greater than that of a ferromagnetic material, and a ferromagnetic material entering the magnetic circuit 112 affects the reluctance R of the magnetic circuit 112, which in turn affects the amount of flux to which the magnetic sensing elements 12.1, 12.2 is exposed, and which is sensed thereby.

The signal 118 from the oscillator 120 is amplified by the associated coil driver 102 and operatively coupled to the at least one coil 98 through an associated sense/test circuit 120. The at least one coil 98 generates a magnetic flux 110 in the magnetic circuit 112, and at least a portion of the magnetic flux 110 is sensed by the magnetic sensing elements 12.1, 12.2 so as to generate an image signal 37. The health and integrity of the at least one coil 98 can be tested for shorts or open conditions by the sense/test circuit 120, or by using the separate sense coil 122 to detect the magnetic flux generated by the at least one coil 98.

The ferromagnetic elements of the seat 108, including the seat frame, can act as a magnetic lens to concentrate or focus the magnetic flux 110 within a region to be sensed. The magnetic flux 110 generally follows a path of least reluctance, which typically would correspond to sections of greatest amounts of magnetically permeable material. Accordingly, the magnetic circuit 112 may be augmented with ferrite or mu-metal elements, or permanent magnets, to further adjust the shape and extent of the magnetic flux field.

Both the power applied to the at least one coil 98, and the gain and/or phase of the signal from the magnetic sensing elements 12.1, 12.2 in relation to the signal 118, may be continuously monitored and stored in a memory 32 of a controller 96 as a real-time magnetic signature of the seat occupancy condition. The real-time magnetic signature is compared with at least one other comparable magnetic signature—for example a magnetic signature representing an empty seat or various magnetic signatures representing various normally seated occupants 106 and out-of-position occupants 106—in order to determine if an associated safety restraint actuator 104 should be disabled to prevent the injury of an out-of-position occupant 106 located sufficiently close to the safety restraint actuator 104 to be susceptible to injury by the deployment thereof. The at least one normal signature may include magnetic signatures that account for variations in the magnetic flux 110 as a result of variations in seating position or variations in temperature. The normal signature may be updated over time so as to track minor perturbations of the seat 108 or of the interior of the vehicle 44.

The separate signals from the separate magnetic sensing elements 12.1, 12.2 add a measurement degree of freedom for each magnetic sensing element 12. Accordingly, a two-dimensional array 80 of magnetic sensing elements 12.1, 12.2 provides an image signal from which a size and position of an occupant 106 can be determined.

The magnetic field sensor 10 may be further adapted to detect an occupant 106 on the seat 108 from the Doppler shift of the frequency of the magnetic flux responsive to the pulsating blood flow of the occupant 106, so as to distinguish between animate and inanimate objects on the seat. Infants are known to have a relatively fast heart rate which could be expected to provide a larger Doppler shift.

A method of sensing an occupant in a vehicle 44 comprises generating a magnetic field 14 from a source located in a seat base 114 of a seat 108, sensing a magnetic field 14 at a plurality of locations within a seat back 116 so as to generate an associated plurality of signals whereby each signal is responsive to a magnetic Field 14 at one of the plurality of locations, generating an image signal 37 from the plurality of signals, and discriminating a property of an occupant 106 on the seat 108, wherein the property is for example a presence of the occupant 106, a size of the occupant 106, of a position of the occupant 106. The generated magnetic field 14 may, for example, comprise an oscillating magnetic field 14 generated by a coil 98 operatively connected to an oscillator 100 through a coil driver 102.

Referring to FIG. 6, another embodiment of a magnetic field sensor 10 comprises a plurality of magnetic sensing elements 12.1, 12.2 disposed on a first surface 105, a plurality of magnetic focusing elements 124 disposed on a second surface 126 proximate to the first surface 105, and a means for generating an image signal 37 from the plurality of the signals.

Each magnetic sensing element 12—for example a Hall-effect sensor element 12.3 or a coil—generates a signal responsive to a magnetic field 14 at the magnetic sensing element 12; the plurality of magnetic sensing elements 12.1, 12.2 thereby generate a corresponding plurality of the signals. As one example, the first surface 105 may be located proximate to a body portion 42 of a vehicle 44. As another example, the first surface 105 is located within a seat back 116 of a seat 108, wherein a source of a magnetic field 14 is incorporated in a seat base 114 of the seat 108.

In accordance with one aspect, the plurality of magnetic sensing elements 12.1 are disposed so as to form a one-dimensional array 15 on the first surface 105, wherein the magnetic field sensor 10 further comprises a means for translating the one-dimensional array 15 in a direction transverse thereto, and a means for providing a translational position thereof to the means for generating an image signal 37, wherein the image signal is responsive to the translational position. In accordance with another aspect, the plurality of magnetic sensing elements 12.2 are disposed so as to form a two-dimensional array 80 on the first surface 105.

Each magnetic focusing element 124 of the plurality of magnetic focusing elements 124 comprises a material having a magnetic permeability substantially greater than air, for example a ferromagnetic material, a ferrite material or a mu-metal material. Each one of the plurality of magnetic focusing elements 124 is proximate to one of the plurality of magnetic sensing elements 12.2 and is shaped—for example a shape like an optical lens—so as to concentrate thereat a magnetic flux 110 from the magnetic field 14. The magnetic focusing elements 124 can be part of a sheet of material located on either the sensing side or the opposite side of the magnetic sensing elements 12.2. The magnetic focusing elements 124 act to improve the clarity of the resulting magnetic image 38. Moreover, a supplemental static or dynamic magnetic field 14 can also be used to improve clarity.

The signals associated with the magnetic field sensor 10 can be generated, adapted or processed in a variety of ways, including but not limited to:

1. AM, FM or pulsed demodulation of the magnetic signature;
2. Multi-tone, multi-phase electronics;
3. A magnetically-biased, phase-shift oscillator for low-cost pure sine wave generation;
4. A coherent synthetic or phased-locked carrier hardware- or microprocessor-based system;
5. A system of microprocessor rain-or offset-tuning through D/A then A/D self-adjust or self-test algorithm;
6. Placing a "standard" in the system safing field for magnetic calibration;
7. Inaudible frequencies;
8. Microprocessor-generated crystal stabilized frequencies for stability, including microprocessor D/A converter for coherent sine-wave generation;
9. Wide-band system electronics;
10. Closed loop gain- and phase-control of the signal to a source coil 98 (i.e. AGC with the magnetic circuit acting as a delay line), wherein the gain- and phase-control signals are used as sensor outputs;

11. Monitoring the power delivered by the coil driver 102;

12. A series-resonant coil driver 102 circuit to increase current to flow to the coil 98 so as to improve the signal-to-noise ratio, wherein the associated current to the coil 98 is monitored to provide a continuous self-test of the coil 98, as well as a measure of the power drawn by the coil 98; and 11. The individual magnetic sensing elements 12.1, 12.2, 12.3 can be oriented in various directions, for example to sense the magnetic field 14 in one or more directions, for example 1, 2 or 3 orthogonal directions. Moreover, the array of magnetic sensing elements 12.1, 12.2, 12.3 can be arranged with either uniform or various differing sensing orientations.

The above described magnetic field sensor 10 can be embodied in various ways. The particular circuitry, whether analog, digital or optical is not considered to be limiting and can be designed by one of ordinary skill in the art in accordance with the teachings herein. For example, where used, an oscillator, amplifier, logic element, modulator, demodulator, A/D converter can be of any known type, for example using transistors, for example field effect or bipolar, or other discrete components; integrated circuits; operational amplifiers, or logic circuits, or custom integrated circuits. Moreover, where used, a microprocessor can be any computing device.

While specific embodiments have been described in detail in the foregoing detailed description and illustrated in the accompanying drawings, those with ordinary skill in the art will appreciate that various modifications and alternatives to those details could be developed in light of the overall teachings of the disclosure. Accordingly, the particular arrangements disclosed are meant to be illustrative only and not limiting as to the scope of the invention, which is to be given the full breadth of the appended claims and any and all equivalents thereof.

We claim:

1. A method of forming and using a magnetic image of a body portion of a vehicle, comprising:
   a. sensing a magnetic field at a plurality of locations proximate to said body portion so as to generate a plurality of signals, wherein each signal of said plurality of signals is responsive to a magnetic field strength at one of said plurality of locations;
   b. generating an image signal from said plurality of signals; and
   c. using a magnetic image from said image signal to adjust a magnetic circuit containing said body portion.

2. A method of forming and using a magnetic image of a body portion of a vehicle as recited in claim 1, wherein said plurality of locations comprise a one-dimensional array of locations, further comprising:
   a. translating said one-dimensional array of locations in a direction that is transverse to said one-dimensional array;
   b. repeating said operation of sensing a magnetic field at a resulting plurality of locations after said operation of translating; and
   c. performing said operations of translating and repeating at least once.

3. A method of forming and using a magnetic image of a body portion of a vehicle as recited in claim 1, wherein said plurality of locations comprise a two-dimensional array of locations.

4. A method of forming and using a magnetic image of a body portion of a vehicle as recited in claim 1, wherein the operation of using said magnetic image to adjust a magnetic circuit comprises locating an element within said body portion, wherein said element is part of a magnetic sensor incorporating said body portion of said vehicle and said element is selected from a magnetic sensing element, a coil, and a ferromagnetic element.

5. A method of forming and using a magnetic image from a body portion of a vehicle, comprising:
   a. sensing a magnetic field at a plurality of locations from within said body portion so as to generate a plurality of signals, wherein each signal of said plurality of signals is responsive to a magnetic field strength at one of said plurality of locations;
   b. generating an image signal from said plurality of signals; and
   c. detecting from said image signal an object proximate to said body portion.

6. A method of forming and using a magnetic image from a body portion of a vehicle as recited in claim 5, wherein said plurality of locations comprise a two-dimensional array of locations.

7. A method of forming and using a magnetic image from a body portion of a vehicle as recited in claim 5, further comprising controlling a safety restraint actuator responsive to the operation of detecting from said image signal an object proximate to said body portion.

8. A method of sensing an occupant in a vehicle, comprising:
   a. generating a magnetic field from a source located in a seat base of a seat;
   b. sensing a magnetic field at a plurality of locations within a seat back so as to generate an associated plurality of signals whereby each signal is responsive to a magnetic field at one of said plurality of locations;
   c. generating an image signal from said plurality of signals; and
   d. discriminating a property of an occupant on said seat, wherein said property is selected from a presence of said occupant, a size of said occupant, and a position of said occupant.

9. A method of sensing an occupant in a vehicle as recited in claim 8, wherein said magnetic field is oscillating.

10. A magnetic field sensor, comprising:
    a. a plurality of magnetic sensing elements disposed on a first surface, wherein said first surface is located within a body portion of a vehicle, whereby each said magnetic sensing element generates a signal responsive to a magnetic field at said magnetic sensing element, said plurality of magnetic sensing elements thereby generating a corresponding plurality of said signals;
    b. a means for generating an image signal from said plurality of said signals; and
    c. a means for discriminating from said image signal an object proximate to said body portion.

11. A sensor for sensing a magnetic field as recited in claim 10, wherein each said magnetic sensing element comprises a Hall-effect sensor.

12. A sensor for sensing a magnetic field as recited in claim 10, wherein said means for generating an image signal comprises a scan converter, wherein said scan converter converts said plurality of said signals to a image signal selected from an RS-170 format signal, an RGB format signal, a raster display signal.

13. A sensor for sensing a magnetic field as recited in claim 10, wherein said plurality of magnetic sensing elements are disposed so as to form a two-dimensional array on said first surface.

14. A sensor for sensing a magnetic field as recited in claim 10, further comprising a means for controlling a safety restraint actuator responsive to said means for discriminating from said image signal an object proximate to said body portion.

15. A magnetic field sensor, comprising:
   a. a plurality of magnetic sensing elements disposed on a first surface, whereby each said magnetic sensing element generates a signal responsive to a magnetic field at said magnetic sensing element, said plurality of magnetic sensing elements thereby generate a corresponding plurality of said signals;
   b. a plurality of magnetic focusing elements disposed on a second surface proximate to said first surface, wherein each magnetic focusing element of said plurality of magnetic focusing elements comprises a material having a magnetic permeability substantially greater than air, said material is selected from a ferromagnetic material, a ferrite material and a mu-metal material, and each one of said plurality of magnetic focusing elements is proximate to one of said plurality of magnetic sensing elements and is shaped so as to concentrate at said one of said plurality of magnetic sensing elements a magnetic flux from the magnetic field; and
   c. a means for generating an image signal from said plurality of said signals.

16. A sensor for sensing a magnetic field as recited in claim 15, wherein each said magnetic sensing element comprises a Hall-effect sensor.

17. A sensor for sensing a magnetic field as recited in claim 15, wherein said means for generating an image signal comprises a scan converter, wherein said scan converter converts said plurality of said signals to a image signal selected from an RS-170 format signal, an RGB format signal, a raster display signal.

18. A sensor for sensing a magnetic field as recited in claim 17, further comprising a display operatively connected to said means for generating an image signal for displaying said image signal.

19. A sensor for sensing a magnetic field as recited in claim 15, wherein said plurality of magnetic sensing elements are disposed so as to form a one-dimensional array on said first surface, further comprising a means for translating said one-dimensional array in a direction transverse to said one-dimensional array, and a means for providing a translational position of said one-dimensional array to said means for generating an image signal, wherein said image signal is responsive to said translational position.

20. A sensor for sensing a magnetic field as recited in claim 19, wherein said first surface is located proximate to a body portion of a vehicle.

21. A sensor for sensing a magnetic field as recited in claim 15, wherein said plurality of magnetic sensing elements are disposed so as to form a two-dimensional array on said first surface.

22. A sensor for sensing a magnetic field as recited in claim 21, wherein said first surface is located within a seat back of a seat, further comprising a source of a magnetic field in a seat base of said seat.

* * * * *